(12) United States Patent
Holsen

(10) Patent No.: US 8,843,538 B2
(45) Date of Patent: Sep. 23, 2014

(54) MEASURING SUM OF SQUARED CURRENT

(75) Inventor: Eivind Holsen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 824 days.

(21) Appl. No.: 12/976,777

(22) Filed: Dec. 22, 2010

(65) Prior Publication Data

US 2012/0166506 A1  Jun. 28, 2012

(51) Int. Cl.
| | | |
|---|---|---|
| *G06F 7/38* | (2006.01) | |
| *G01R 19/00* | (2006.01) | |
| *G01R 19/10* | (2006.01) | |
| *G01R 19/25* | (2006.01) | |

(52) U.S. Cl.
CPC ............... *G01R 19/10* (2013.01); *G01R 19/25* (2013.01)
USPC .......................................... 708/200; 702/64

(58) Field of Classification Search
CPC ........ G01R 21/06; G01R 19/00; G01R 19/02; G01R 19/12; G01R 19/22; G01R 19/25; G01R 19/255
USPC ...................... 708/200, 313; 341/143; 702/64
See application file for complete search history.

(56) References Cited

U.S. PATENT DOCUMENTS

| | | | |
|---|---|---|---|
| 5,955,869 A | 9/1999 | Rathmann | |
| 6,012,153 A | 1/2000 | Brink et al. | |
| 6,025,695 A | 2/2000 | Friel et al. | |
| 6,040,722 A | 3/2000 | Lee | |
| 6,078,165 A | 6/2000 | Ashtiani et al. | |
| 6,417,792 B1 * | 7/2002 | King et al. | 341/143 |
| 6,555,997 B1 * | 4/2003 | De Vries et al. | 324/74 |
| 6,710,578 B1 | 3/2004 | Sklovsky | |
| 6,795,007 B2 * | 9/2004 | Mayes | 341/143 |
| 7,236,110 B2 * | 6/2007 | Antonesei | 341/61 |
| 7,567,063 B1 | 7/2009 | Suzuki et al. | |
| 7,605,568 B2 | 10/2009 | Gangstoe et al. | |
| 8,245,214 B2 | 8/2012 | Long et al. | |
| 8,350,529 B2 | 1/2013 | Loncarevic | |
| 2006/0170398 A1 | 8/2006 | Gangstoe et al. | |
| 2008/0189563 A1 | 8/2008 | Itkin | |
| 2008/0197809 A1 | 8/2008 | Ho et al. | |
| 2008/0231232 A1 | 9/2008 | Seo et al. | |
| 2008/0284383 A1 | 11/2008 | Aas et al. | |
| 2008/0300660 A1 | 12/2008 | John | |
| 2009/0198399 A1 | 8/2009 | Kubo et al. | |

(Continued)

OTHER PUBLICATIONS

ATMEL®: "8-bit AVR® Microcontroller with 16K/32K Bytes In-System Programmable Flash—ATmega16HVB, ATmega32HVB Preliminary", 8042B-AVR-06/10, 275 pages (Jun. 2010).

(Continued)

*Primary Examiner* — Chuong D Ngo
(74) *Attorney, Agent, or Firm* — Fish & Richardson P.C.

(57) ABSTRACT

A modulator can be configured to sense a change in current flow in a circuit and to generate an oversampled, noise-shaped signal. A first decimation filter is coupled to the modulator and is configured to generate instantaneous current data at a first data rate. The instantaneous current data can be input into a multiplier circuit. The output of the multiplier circuit (the instantaneous current data squared) can be input to a second decimation filter. The second decimation filter can be configured to generate a sum of the squared current data at a second data rate. The sum of the squared current data can be used by an application (e.g., battery power management) to compute power measurements or for other purposes.

11 Claims, 3 Drawing Sheets

(56) References Cited

U.S. PATENT DOCUMENTS

| | | |
|---|---|---|
| 2009/0224741 A1 | 9/2009 | Marholev et al. |
| 2010/0229011 A1 | 9/2010 | Pedersen et al. |
| 2010/0287389 A1 | 11/2010 | Gangsto et al. |
| 2010/0332233 A1 | 12/2010 | Chen et al. |
| 2011/0025277 A1 | 2/2011 | Hussain et al. |
| 2012/0161746 A1 | 6/2012 | Holsen et al. |
| 2012/0162828 A1 | 6/2012 | Holsen et al. |
| 2012/0166506 A1 | 6/2012 | Holsen |
| 2012/0166841 A1 | 6/2012 | Holsen et al. |
| 2012/0166855 A1 | 6/2012 | Holsen et al. |
| 2012/0166918 A1 | 6/2012 | Svendsli et al. |
| 2012/0170157 A1 | 7/2012 | Holsen et al. |

OTHER PUBLICATIONS

ATMEL®: "8-bit AVR® XMEGA A Microcontroller—XMEGA Manual Preliminary", 8077H-AVR-12/09, 445 pages, (Dec. 2009).

Non-final office action issued in U.S. Appl. No. 12/976,884 dated May 17, 2013, 9 pgs.

Non-final office action issued in U.S. Appl. No. 12/976,845 dated Jan. 30, 2013, 9 pgs.

Non-final office action issued in U.S. Appl. No. 13/412,937 dtd Apr. 25, 2013, 12 pgs.

Non-final office action issued in U.S. Appl. No. 12/976,898 dtd Apr. 26, 2013, 12 pgs.

Final office action issued in U.S. Appl. No. 12/976,865 dtd May 24, 2013, 19 pgs.

Non-final office action issued in U.S. Appl. No. 12/976,865 dtd Dec. 28, 2012, 15 pgs.

Final office action issued in U.S. Appl. No. 12/976,845 dtd Aug. 14, 2013, 9 pgs.

Non-final office action issued in U.S. Appl. No. 13/410,806 dtd Aug. 15, 2013, 12 pgs.

Final office action issued in U.S. Appl. No. 12/976,898 dtd Sep. 3, 2013, 14 pgs.

Non-final office action issued in U.S. Appl. No. 12/976,865 dtd Sep. 13, 2013, 9 pgs.

Final office action issued in U.S. Appl. No. 12/976,884 dtd Oct. 23, 2013, 6 pgs.

Office action issued in the U.S. Appl. No. 12/976,845 dtd Jan. 29, 2014, 9 pgs.

Final office action issued in the U.S. Appl. No. 12/976,865, dtd Feb. 27, 2014, 11 pgs.

* cited by examiner

MEASURING SUM OF SQUARED CURRENT

TECHNICAL FIELD

This subject matter is generally related to electronics, and more particularly to current measurement systems.

BACKGROUND

A battery management system can include one or more integrated circuit devices that manage a rechargeable battery (e.g., a cell or battery pack) by monitoring its state. Some battery management systems monitor rechargeable battery packs. An integrated circuit in the battery pack monitors the battery and reports information to a system management bus. This information can include but is not limited to: battery type, model number, manufacturer, characteristics, discharge rate, predicted remaining capacity and any other information that can be used to determine the state of the battery.

Some applications monitor the State of Charge (SOC) of the battery or of the individual cells in a battery chain. This may simply be for providing the user with an indication of the capacity left in the battery, or it could be needed in a control circuit to ensure optimum control of the charging process. The State of Health (SOH) is a measure of a battery's capability to deliver its specified output. This can be vital for assessing the readiness of emergency power equipment and can be an indicator of whether maintenance action is needed.

SUMMARY

A modulator can be configured to sense a change in current flow in a circuit and to generate an oversampled, noise-shaped signal. A first decimation filter is coupled to the modulator and is configured to generate instantaneous current data at a first data rate. The instantaneous current data can be input into a multiplier circuit. The output of the multiplier circuit (the instantaneous current data squared) can be input to a second decimation filter. The second decimation filter can be configured to generate a sum of the squared current data at a second data rate. The sum of the squared current data can be used by an application (e.g., battery power management) to compute power measurements or for other purposes.

Particular implementations of the invention can be implemented to realize one or more of the following advantages: 1) a cost efficient solution to measure and calculate a sum of squared current when the current itself is measured and the sum is calculated, 2) a cost efficient solution that reuses existing ADC circuitry to generate the sum of squared current on a single integrated circuit chip, and 3) a reduced physical footprint.

DETAILED DESCRIPTION

System Overview

Figure 1:
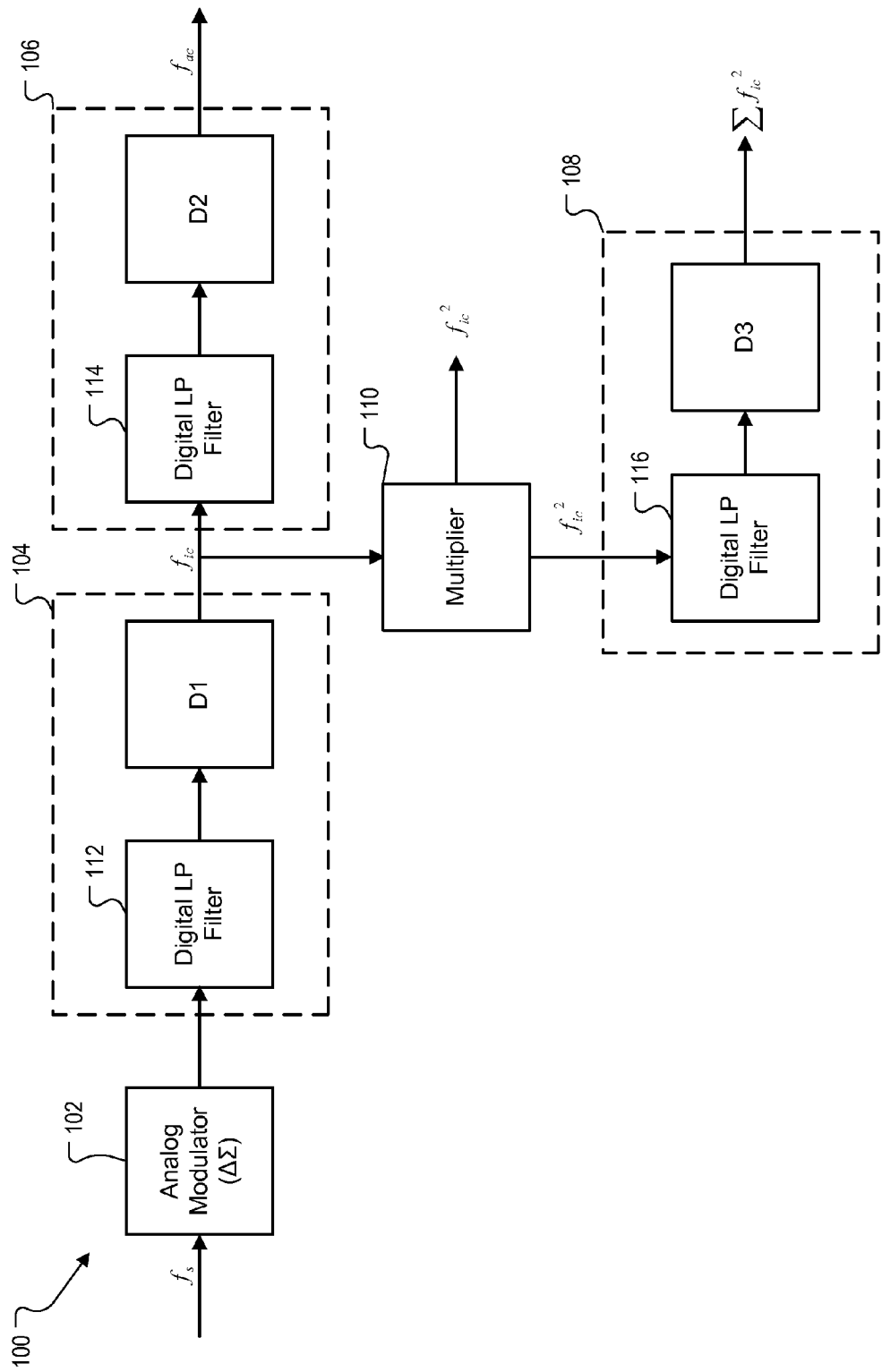
FIG. 1 is a block diagram of an exemplary current measuring system.

FIG. 1 is a block diagram of an exemplary current measuring system 100. In some implementations, system 100 can include modulator 102, decimation filter stages 104, 106, 108 and multiplier 110. Decimation filter stages 104, 106, 108 can include digital low pass filters 112, 114, 116 respectively. In some implementations, the current measuring system can be part of a current sensing analog-to-digital converter (CS-ADC), as described in U.S. Pat. No. 7,113,122, which is incorporated by reference herein in its entirety. The CS-ADC can be part of a variety of devices such as a microcontroller, digital signal processor (DSP), digital camera, PDA or the like.

In a CS-ADC implementation, a sampling circuit (e.g., a switch coupled to a sampling capacitor) can sample the charge or discharge current flowing through an external or internal sense resistor. The sample can be processed by modulator 102 (e.g., 1-bit delta-sigma modulator) which generates an oversampled noise-shaped (most of the noise energy in high signals) signal. Decimation filter stage 104 can be coupled to modulator 102 and configured to remove out-of-band noise from the signal and to reduce the data rate of the signal to generate a high-resolution signal. The output of decimation filter stage 104 is instantaneous current data ($f_{ic}$) with a resolution and conversion time suitable for instantaneous current measurements.

Decimation filter stage 106 is coupled to decimation filter stage 104. The output of decimation filter stage 106 is accumulated current data ($f_{ac}$) with a resolution and conversion time suitable for charge flow accumulation measurements. In some implementations, the instantaneous current data has a short conversion time at the cost of lower resolution. The accumulated current data provides a highly accurate current measurement for coulomb counting. The conversion time of the accumulated current data can be configured to trade accuracy against conversion time.

In some implementations, digital low pass filter 112 in decimation filter stage 104 can be a third order sinc filter with a data output having a data rate that is reduced by a predetermined decimation ratio D1 (e.g., 128). For example, if D1 is 8:1 and operates on the 1-bit input stream 10010110, the decimation result is 4/8=0.5=100b (binary). This reduces the sample frequency ($f_s$) by a factor of eight. The serial (1-bit) input bus can become a parallel (3-bits) output bus.

The digital low pass filter 114 in decimation filter stage 106 can be a first order sinc filter with a data output having a data rate that is reduced by a configurable decimation ratio D2 (e.g., 32, 64, 128, 256). Decimation filter stages 104, 106 can be implemented using a cascaded integrator-comb combination (CIC) structure, where data is accumulated, decimated and differentiated. In some implementations, computations can be performed using wrap around 2 s complement arithmetic. In some implementations, filters 112, 114 are linear phase, finite impulse response (FIR) filters. Suitable CIC structures are described in U.S. Pat. No. 7,113,122.

In some implementations, the instantaneous current data are input into multiplier 110. Multiplier 110 multiplies each instantaneous current data by itself to generate the square of the instantaneous current data ($f_{ic}^2$). The square of the instantaneous current data is input into decimation filter stage 108. Decimation filter stage 108 generates a sum (average) of the squared data ($\Sigma f_{ic}^2$).

The digital low pass filter 116 in decimation filter stage 108 can be a first order sinc filter with a data output having a data rate that is reduced by a configurable decimation ratio D3. Decimation filter stage 108 can have the same internal structure as decimation filter stage 106 (e.g., a CIC structure). In some implementations, decimation filter stage 108 can be omitted and the circuitry in decimation filter stage 106 can be used to generate the sum (average) of the squared current data.

The outputs of decimation filter stages 104, 106 and 108 can be coupled to data registers for storing instantaneous current data, accumulated current data and the accumulated squared current data, respectively. Additionally, a data register can be coupled to the output of multiplier 110 to store the squared instantaneous current data. The data registers can be accessible by firmware executed by a controller or central processing unit (CPU) and provided to applications.

Exemplary Digital Multiplier Circuit

Figure 2:
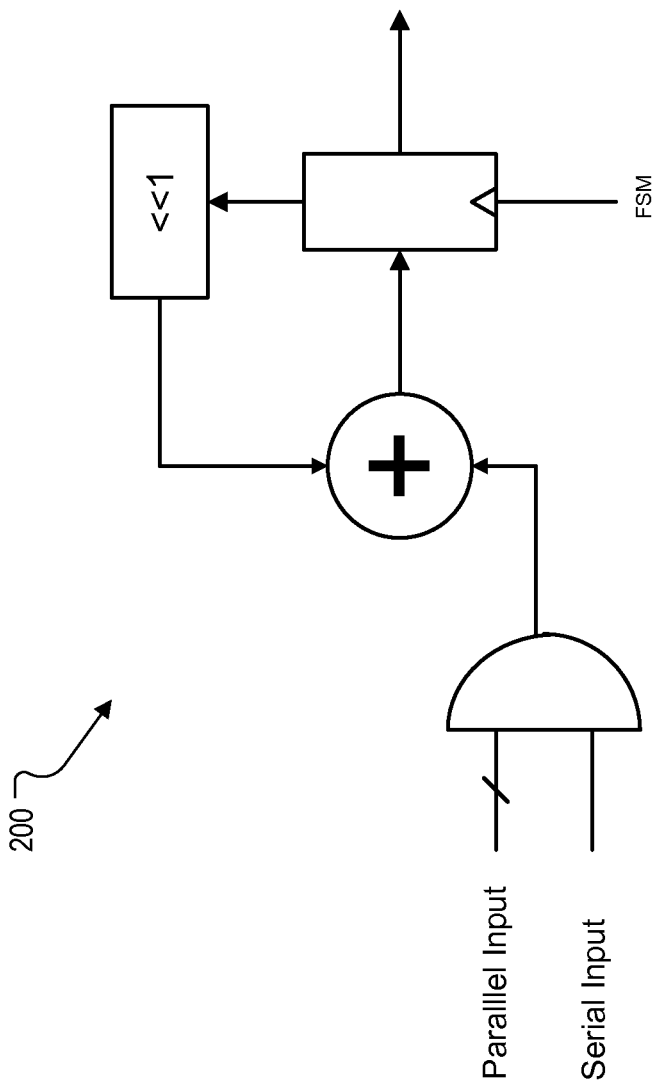
FIG. 2 is a schematic diagram of an exemplary digital multiplier.

FIG. 2 is a schematic diagram of an exemplary digital multiplier. The digital multiplier shown is a scaling accumulator multiplier 200. Scaling accumulator multiplier 200 performs multiplication using an iterative shift-add routine. One input (e.g., a sample of instantaneous current) is presented in bit parallel form while the other input (e.g., the same sample of instantaneous current) is in bit serial form. Each bit in the serial input multiplies the parallel input by either 0 or 1. The parallel input is held constant while each bit of the serial input is presented. Note that the one bit multiplication either passes the parallel input unchanged or substitutes zero. The result from each bit is added to an accumulated sum. That sum is shifted one bit before the result of the next bit multiplication is added to it.

Other multipliers that can be used in system 100 include but are not limited to: serial by parallel Booth multipliers, ripple carry array multipliers, row adder tree multipliers, carry save array multipliers, look-up table (LUT) multipliers, partial product LUT multipliers, computed partial product multipliers, constant multipliers from adders, constant coefficient multiplier (KCM), limited set LUT multipliers, Wallace Trees or any other known digital multiplier.

Exemplary Process

Figure 3:
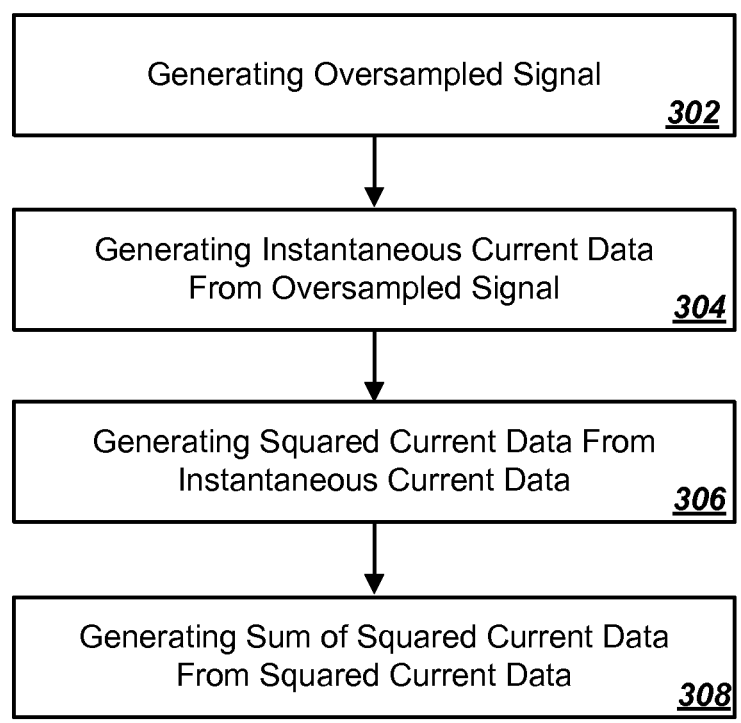
FIG. 3 is a flow diagram of an exemplary process for calculating a sum of squared current data.

FIG. 3 is a flow diagram of an exemplary process 300 for calculating a sum (average) of squared current data. Process 300 can be implemented by system 100.

In some implementations, process 300 can begin by generating an oversampled signal (302). For example, a delta-sigma modulator can be used to generate an oversampled, noise-shaped signal from current flowing through a sense resistor of a CS-ADC or other current measuring device or system.

Process 300 decimates the oversampled signal to generate high-resolution, instantaneous current data (304). The instantaneous current data can be stored in a first data register accessible by firmware. Step 304 can be implemented by a third order sinc filter configured to reduce the data rate of the high-resolution, instantaneous current data according to a predefined or configurable decimation ratio.

Process 300 multiples the instantaneous current data by itself to generate squared current data (306). The squared current data can be stored in a second data register accessible by firmware. Step 306 can be implemented by a digital multiplier circuit, such as the circuits described in reference to FIG. 2.

Process 300 decimates the squared current data to provide a sum (average) of squared current data (308). The sum of squared current data can be stored in a third data register accessible by firmware. Step 308 can be implemented by a first order sinc filter configured to reduce the data rate of the sum of squared current data according to a predefined or configurable decimation ratio.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A circuit comprising:
    a modulator configured for oversampling a current flow and generating an oversampled signal;
    a first decimation filter stage coupled to the modulator, the first decimation filter stage configured for decimating the oversampled signal to generate a high resolution signal indicating instantaneous current data;
    a digital multiplier coupled to the first decimation filter stage, the digital multiplier configured for generating squared current data from the instantaneous current data; a second decimation filter stage coupled to the digital multiplier, the second decimation filter stage configured for decimating the squared current data to generate a sum of squared current data; and
    a third decimation filter stage coupled to the output of the first decimation filter stage, the third decimation filter stage configured for reducing a data rate of the high resolution signal and generating accumulated current data for charge flow accumulation.

2. The circuit of claim 1, further comprising:
    one or more data registers for storing one or more measurements of the instantaneous current data, squared current data or sum of squared current data.

3. The circuit of claim 1, where the first decimation filter stage is configured to decimate the oversampled signal according to a first decimation ratio and the second decimation filter stage is configured to decimate the squared current data according to a second decimation ratio.

4. The circuit of claim 1, where the first decimation filter stage includes a third order sinc filter and the second decimation filter stage includes a first order sinc filter.

5. The circuit of claim 1, where the modulator is a delta-sigma modulator.

6. The circuit of claim 1, where the circuit is included in a current sensing analog-to-digital converter (CS-ADC).

7. The circuit of claim 6, where the CS-ADC is included in a microcontroller.

8. The circuit of claim 1, where at least one of the first, second or third decimation filter stages is implemented in a cascade integrator-comb combination (CIC) structure.

9. The circuit of claim 8, where the first decimation filter is a third order sinc filter and the second decimation filter and the third decimation filter stage are first order sinc filters.

10. A circuit comprising:
    a modulator configured to sense a change in current and to generate an oversampled signal;
    a first decimation filter stage coupled to the modulator, the first decimation filter stage configured for removing outof-band noise from the oversampled signal and for reducing a data rate of the oversampled signal to generate a high resolution signal indicating instantaneous current data;

a multiplier coupled to the first decimation filter stage, the multiplier configured for generating squared current data from the instantaneous current data;

a second decimation filter stage coupled to the multiplier, the second decimation filter stage configured for reducing a data rate of the squared current data and generating sum of squared current data; and a third decimation filter stage coupled to the output of the first decimation filter stage, the third decimation filter stage configured for reducing a data rate of the high resolution signal and generating accumulated current data for charge flow accumulation.

11. The circuit of claim 10, where the modulator is a delta-sigma modulator.

* * * * *